United States Patent [19]
Hastings et al.

[11] Patent Number: 4,841,235
[45] Date of Patent: Jun. 20, 1989

[54] MRS CURRENT SENSOR

[75] Inventors: Jerome K. Hastings, Sussex; Bruce C. Beihoff, Glendale; Michael S. Baran, Wauwatosa; Mark A. Juds, New Berlin; James E. Hansen, Oka Creek, all of Wis.

[73] Assignee: Eaton Corporation, Cleveland, Ohio

[21] Appl. No.: 61,351

[22] Filed: Jun. 11, 1987

[51] Int. Cl.[4] ............... G01R 19/00; G01R 33/02
[52] U.S. Cl. .................. 324/117 R; 324/127; 324/252
[58] Field of Search ............ 324/117 H, 252, 251, 324/127, 117 R; 307/309; 338/32 R

[56] References Cited
U.S. PATENT DOCUMENTS
2,946,955  7/1960  Kuhrt ..................... 324/117 H OTHER PUBLICATIONS
Middelhoek, Si, "Magnetic. . ." IBM Tech. Dis. Bull.; vol. 4; No. 6; Nov. 1961; pp. 42–43; Gusev et al.; Measurement. . .;1975; pp. 952–955.

Primary Examiner—Ernest F. Karlsen
Attorney, Agent, or Firm—J. G. Lewis

[57] ABSTRACT

A current sensor (10) comprising spaced pole pieces (62, 64) and a magnetic shunt (80) bridging the pole pieces within an insulating housing assembly (12) which also contains a magnetoresistive transducer (90) and electronic circuitry (16) for sensing magnetic field intensity between the pole pieces and relating that intensity as electric signals provided at terminals (26) at the exterior of the housing. The transducer senses magnetic field intensity along a principal axis (88). Permanent magnets (94, 96) or induction coils (276, 278) are provided to establish a biasing component of magnetic field intensity along an axis (98) substantially normal to the principal axis to improve sensor sensitivity, range of operation and immunity to current overload.

28 Claims, 6 Drawing Sheets

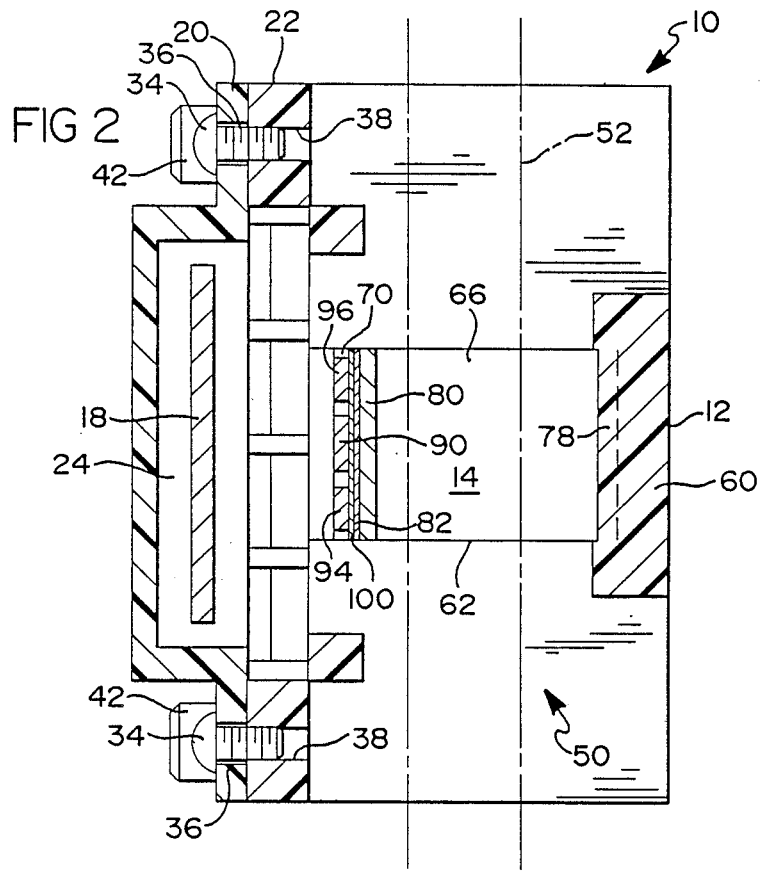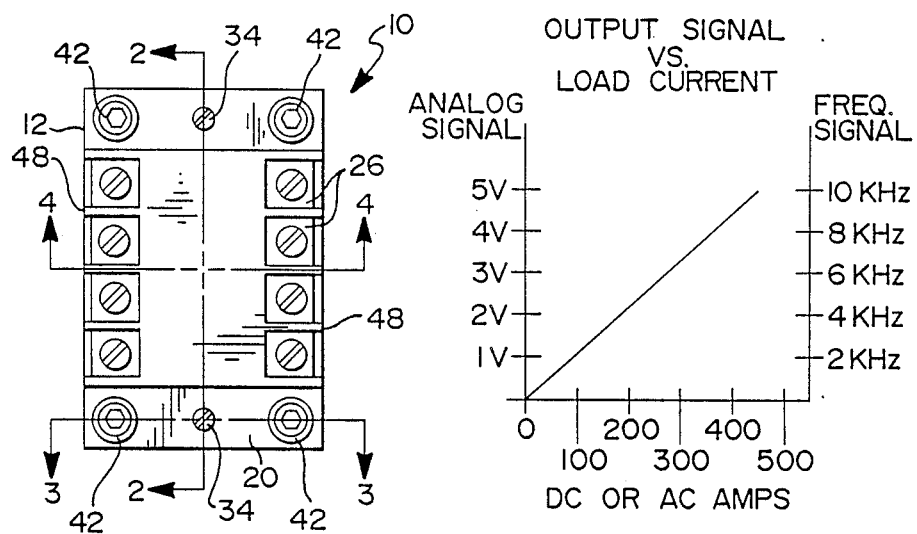

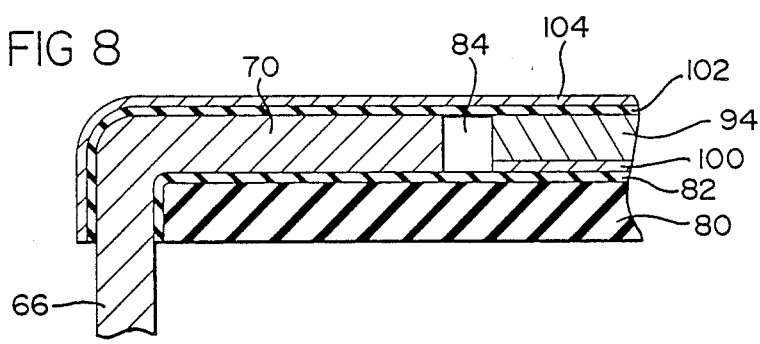
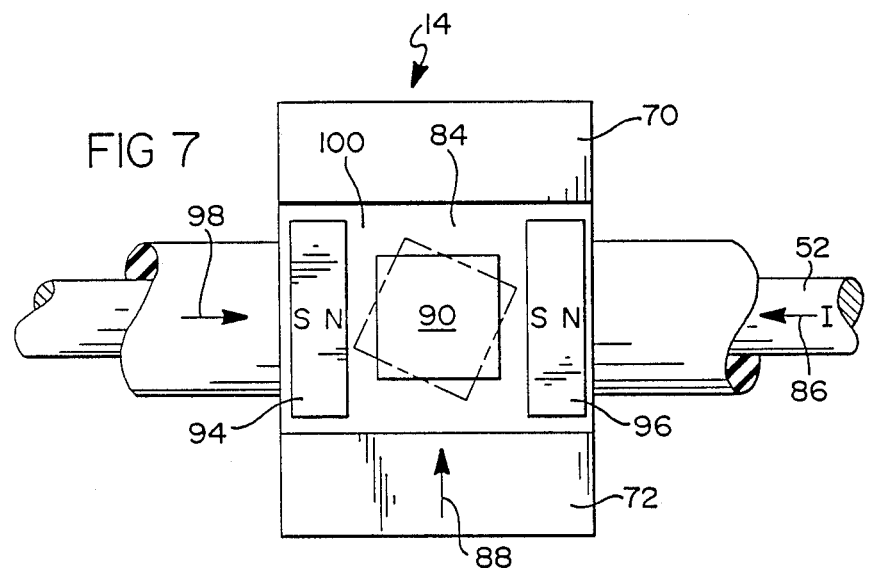
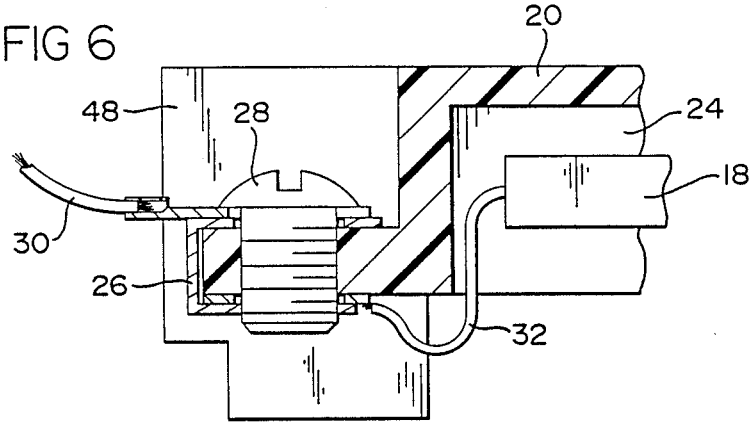

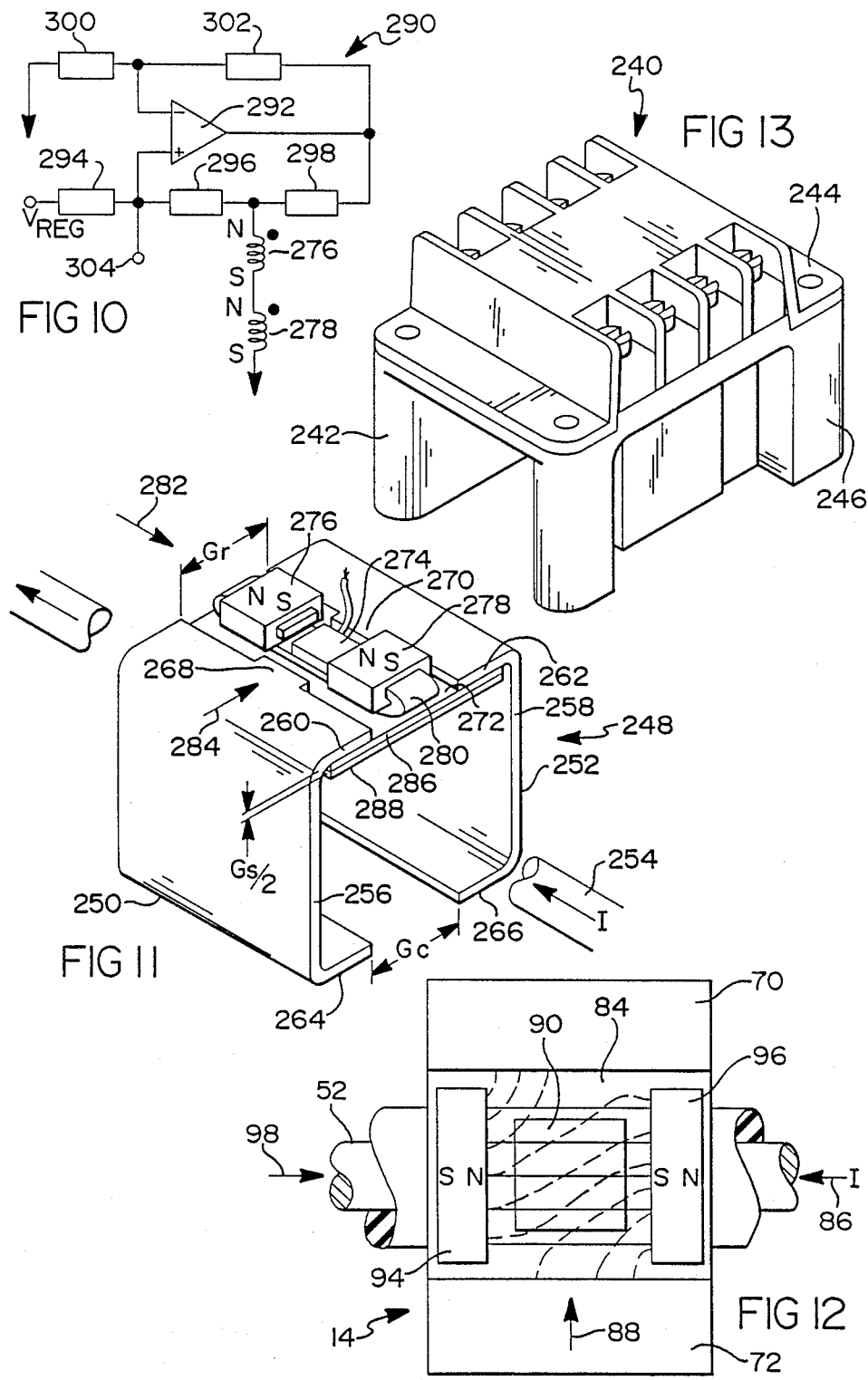

மற்றும் 4,841,235

MRS CURRENT SENSOR

TECHNICAL FIELD

The present invention relates to current sensors for measuring electrical current in a conductor and is particularly directed to current sensors for aerospace or other high performance applications where extreme accuracy, extended range of operation, light-weight and compact design represent premium features.

CROSS REFERENCE TO RELATED APPLICATION

This application is related to a copending application entitled Current Sensor for Universal Application, S.N. 061355, filed concurrently herewith in the name of Jerome K. Hastings, Bruce C. Beihoff, Michael S. Baran, and Mark A. Juds and assigned to the assignee of this application.

BACKGROUND OF THE INVENTION

It is known to detect and measure the current flowing in an electrical conductor by disposing a current transformer around the conductor to pick up the magnetic flux generated by the current in the conductor and, with appropriate circuitry and indicating instruments, relate that flux to a measurement of the current flowing in the conductor. Current transformers are generally large, heavy devices and are not well suited for high performance applications where light-weight, great accuracy, and reliable operation through extreme temperature changes is required. Moreover, current transformers are restricted by sensing A.C. currents.

Hall effect sensors have likewise been applied to measure current. However, they tend to be fragile devices and range limited, and are thus unsuitable in some applications. Furthermore, Hall sensors do not provide field shaping or transformer action needed to concentrate magnetic flux field for extremely sensitive contactless measurement.

Current shunts are frequently employed to measure extremely high currents. However, shunts tend to be heavy and expensive and are limited to sensing D.C. currents. Furthermore, shunts are placed in series circuit with a conductor carrying the measured current and can represent a safety hazard if they fail in an open circuit condition. Considerations of reliability and weight are particularly acute in aerospace applications where system designs frequently dictate use dozens of such devices.

BRIEF DESCRIPTION OF THE INVENTION

The present invention provides a new and improved current sensor for measuring A.C. and/or D.C. current flow in an electrical conductor. Specifically, the present invention includes a magnetic flux concentrator having a magnetic pole structure substantially encircling the cross-sectional shape of the conductor with two magnetic pole portions which are spaced from one another to provide a magnetic sensing region therebetween. Electrical current flowing in the conductor will induce a magnetic field in the region. Means are provided to measure a component of magnetic field intensity along a principal axis within the sensing region and to further generate an output signal as a function thereof. Finally, means are provided to generate a biasing component of magnetic field intensity within the region along a second axis, offset from the principal axis, such that the offset component of magnetic field intensity is unaffected by flow of current in the conductor. This arrangement has the advantage of providing an increase in sensing range without increasing the weight or size of the device and further protects the device from overload due to high current.

According to another aspect of the invention, the means operative to generate the magnetic field bias comprises a permanent magnet, coil or equivalent device disposed adjacent a magnetoresistive transducer within the sensing region and oriented to produce a magnetic field essentially normal to the field created by current flowing in the conductor. This arrangement provides the advantage of a constant biasing field which can be easily adjusted for scaling or temperature compensation.

According to another aspect of the invention a magnetic shunt is provided to bridge the two magnetic pole portions. The shunt is insulatively separated from the pole portions but serves to divert a substantial portion of the flux from the sensing region. This arrangement has the advantage of permitting use of small sensitive components for extended accuracy while protecting them from large current overloads.

According to still another object of the invention, shield means are provided to insulatively overlay the magnetic pole portions and sensing region for isolation from externally generated electro-magnetic fields. This arrangement has the advantage of permitting installation of the inventive device within electro-magnetically "dirty" environments.

According to still another aspect of the invention, the flux concentrator is housed within a body portion closed by a top portion and held in assembly prior to end-use installation by ordinary fastening means such as screws. Registering bores in the top and body portions are provided for receiving mounting hardware once in end-use installation. This arrangement has the advantage of providing an extremely small and rugged device particularly well suited for aerospace and other applications characterized by high load forces.

Various other features and advantages of the present invention will become apparent upon a reading of the following specification, which, along with the patent drawings, describes preferred and alternative illustrative embodiments of the invention in detail.

The detailed description of the specific embodiments makes reference to the accompanying drawings.

BRIEF DESCRIPTION OF THE DRAWINGS

FIG. 1 is a top plan view of the preferred current sensor of the present invention;

FIG. 2 is a cross-sectional view on an enlarged scale of the current sensor shown in FIG. 1 taken along the line 2—2 in FIG. 1;

FIG. 2 is a cross-sectional view on an enlarged scale of the current sensor shown in FIG. 1 taken along the line 3—3 in FIG. 1;

FIG. 6 is a fractional sectional view on an enlarged scale of the top portion of the housing of the current sensor of FIG. 1;

FIG. 7 is a top plan view of the flux concentrator of FIG. 5 for the preferred and an alternative embodiment of the present invention;

FIG. 8 is a broken sectional view on an enlarged scale of an alternative embodiment of the flux concentrator of FIG. 5;

FIG. 10 is a schematic diagram of additional circuit elements added to the schematic diagram of FIG. 9 for an alternative embodiment of the present invention;

FIG. 11 is an isometric view of an alternative embodiment of the flux concentrator;

FIG. 12 is a top plan view of the preferred flux concentrator of the present invention correlating with FIG. 7 and including representative magnetic field flux lines within a magnetic sensing region;

FIG. 13 is an isometric view of the current sensor of an alternative embodiment of the present invention; and FIG. 14 is a graphical representation of typical output signals vs. sensed load current characteristic for the accompanying drawings.

Figure 3:
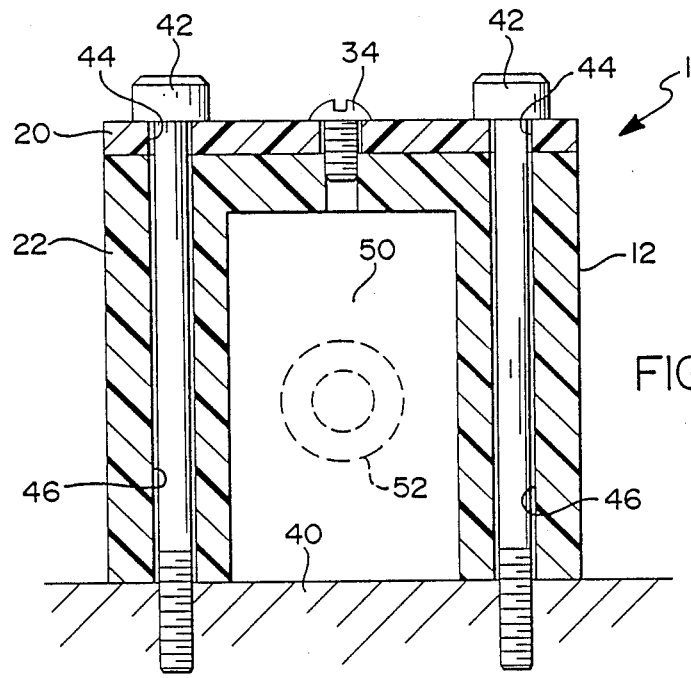
FIG. 3 is a cross-sectional view on an enlarged scale of the current sensor shown in FIG. 1 taken along the line 4—4 in FIG. 1.
Figure 4:
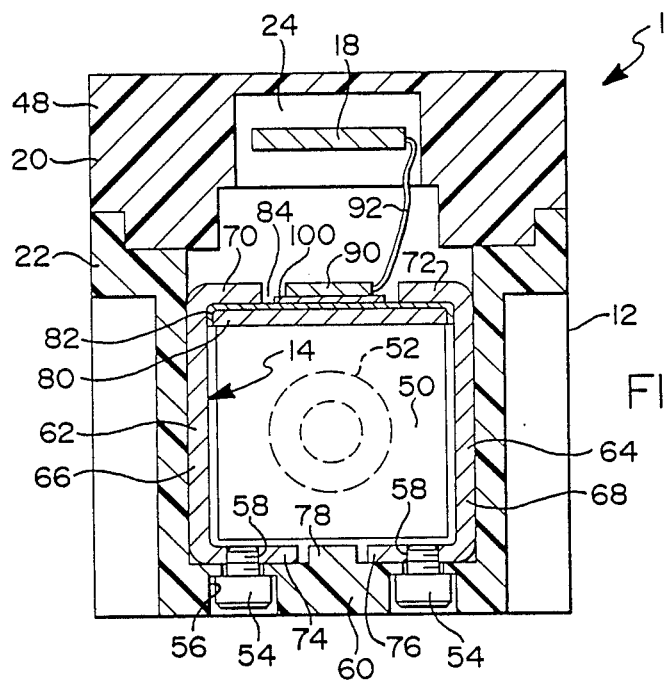
Figure 5:
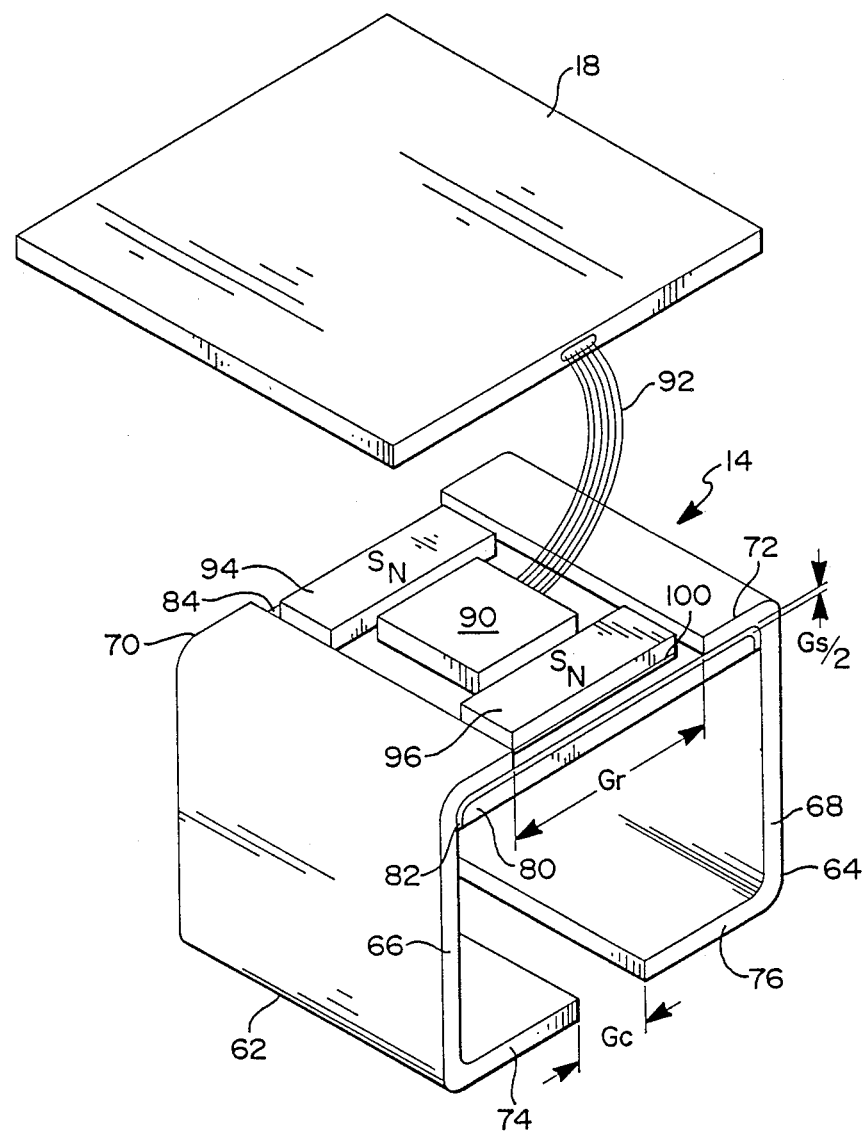
FIG. 5 is an isometric view of the flux concentrator and circuit board contained in the current sensor of FIG. 1.

DETAILED DESCRIPTION OF THE PREFERRED AND ALTERNATIVE EMBODIMENTS OF THE INVENTION

Referring to FIGS. 1 through 5, the preferred embodiment of a magnetoresistive structure (MRS) based current sensor 10 is illustrated. Sensor 10 has a generally rectangular housing assembly 12 containing a flux concentrator 14 and a control circuit 16 (shown schematically in FIG. 9) carried on a circuit board 18 therein. Housing assembly 12 comprises top and body portions 20 and 22, respectively, constructed of light-weight molded insulating material suitable for withstanding a −50 to +150° C. environment.

Top portion 20 defines a cavity 24 for receiving circuit board 18 therein. Circuit board 18 is retained in its illustrated position such as by potting material (not shown) or other suitable known fastening means. Top portion 20 carries a number of terminal assemblies 26 with threaded fasteners 28 for electrically interfacing sensor 10 with a host circuit via appropriate electrical conductors 30. Each terminal assembly 26 is also electrically in-circuit with control circuit 16 via conductors 32 extending between terminal assemblies 26 and circuit board 18, as will be described in detail hereinbelow.

Prior to assembly in a host system, top portion 20 and body portion 22 are held in assembly by suitable fastening means such as screws 34 which pass freely through bores 36 in top 20 to threadably engage registering bores 38 in body 22. In application, sensor 10 is rigidly mounted to a host apparatus 40 (see FIG. 3) by suitable fastening means such as tie-down bolts 42 which freely extend through registering through-bores 44 and 46 in top and body portions 20 and 22, respectively, and threadably engage host apparatus 40. This multiple tie-down technique is necessitated in aerospace and other high performance applications where sensor 10 is subjected to extreme vibration, gravitational loading and temperature change. Top 20 has electrically insulating partitions 48 integrally formed thereon interspacing terminal assemblies 26 to prevent inadvertent electrical cross-connection therebetween.

Housing assembly 12 has its top and side portions substantially closed. The ends of housing assembly 12 are open to define a generally rectangular through-passageway 50 to receive one or more insulated electrical conductors 52 therethrough.

Flux concentrator 14 is retained within body 22 by suitable fastening means such as screws 54 which extend freely through counter-sunk bores 56 to threadably engage registering bores 58 formed in concentrator 14. Concentrator 14 is generally square in cross-section and is opened at its ends to permit conductor 52 to extend therethrough. Bores 56 are formed in a bottom portion 60 of body 22.

As can best be seen in FIGS. 2, 4, 5, and 7 concentrator 14 is formed of two generally C-shaped pole pieces 62 and 64 which coact to form a magnetic pole structure which substantially encircles the cross-sectional shape of conductor 52. Pole pieces 62 and 64 comprise complimentarily shaped vertically disposed riser portions 66 and 68, respectively, and an upper pair of horizontally oriented inwardly directed pole portions or pieces 70 and 72 integrally depending from riser portions 66 and 68, respectively. Concentrator 14 further includes a lower pair of horizontally disposed inwardly directed pole portions or pieces 74 and 76 integrally depending from riser portions 66 and 68, respectively.

Pole portions 70 and 72 are spaced by a horizontal gap designated $G_r$ (reference FIG. 5) and lower pole portions 74 and 76 are separated by a horizontal calibration gap designated $G_c$ as will be described in detail hereinbelow. Bottom portion 60 of body 22 has an upwardly directed rib 78 integrally formed therewith extending longitudinally through passageway 50. Rib 78 extends into calibration gap $G_c$ to insure that the spacing between lower pole portions 74 and 76 is maintained. Pole pieces 62 and 64 are formed of a low carbon magnetically conductive ferrous material such as steel. In application, insulating spacer means (not shown) are preferably provided to ensure that conductor 52 is rigidly maintained at or near the central axis of passageway 50.

As illustrated in FIGS. 2, 4, 5 and 8, upper pole portions 70 and 72 are bridged by a magnetically conductive shunt 80. Shunt 80 is held in position by any suitable non-magnetically conductive fastening means (not shown) and is insulated from riser portions 66 and 68 and upper pole portions 70 and 72 by a thin layer of phenolic insulating material 82. Insulating material 82 thus spaces shunt 80 from each upper pole portion 70 and 72 by a dimension designated $G_s/2$ as will be described in detail hereinbelow. The space between upper pole portions 70 and 72 adjacent shunt 80 is designated as a magnetic sensing region 84. Shunt 80 is formed of any suitable material having a characteristic permeability equal to or exceeding the characteristic permeability of the material in pole pieces 62 and 64. Flux concentrator 14 thus defines a magnetic circuit including pole pieces 62 and 64, series calibration gap $G_c$ between lower pole portions 74 and 76, a second series gap, designated $G_r$ defined between upper pole portions 70 and 72, and a shunt 80 with series gap designated $G_s$ (one of dimension $G_s/2$ at each end of shunt 80) disposed in parallel with gap $G_r$. When the current carrying conductor 52 extends through passageway 50, a magnetic field will be induced within sensing region 84 proportional to the current flow.

Referring to FIG. 7, assuming current flow within conductor 52 is in the direction designated by arrow 86, a magnetic field will be induced in sensing region 84 characterized by lines of flux having a principal axis in the direction designated by arrow 88 which, for the purposes of this application is defined as the measured field. Shunt 80 operates to divert a substantial portion of the total flux within concentrator 14 from sensing region 84. Accordingly, measurement means placed within region 84 can provide extreme accuracy while reading only a small percentage of the induced field.

Sensing of the field is affected by the use of an MR transducer of the type manufactured by Amperex Division of North American Phillips Model KMZ10C90 disposed centrally within region 84 and aligned to measure the field along principal axis 88. MR transducer 90 is electrically inter-connected with control circuit 16 by wires 92. Permanent magnets 94 and 96 are disposed within sensing region 84 adjacent the sides of transducer 90 and oriented to establish a biasing component of magnetic field intensity along an offset or biasing axis normal to the principal axis 88 designated by arrow 98. Although two magnets 94 and 96 are illustrated, it is contemplated that more or fewer could be employed. However, the applicants have found that a pair of magnets astride transducer 90 with reinforcing pole orientation provides satisfactory sensor performance.

A magnetic return path is provided for the biasing field by a thin layer of soft magnetic metal 100 within region 84 underlying transducer 90 and magnets 94 and 96. Magnets 94 and 96 and return path 100 are spaced from upper pole portions 70 and 72.

The sensor 10 described hereinabove was specifically intended for a ±100 amp DC current application. It is contemplated however that various spatial relationships between gaps $G_r$, $G_c$ and $G_s$ could be varied as well as the relative placement of transducer 90 and magnets 94 and 96 with respect to concentrator 14 depending upon the particular application, sensitivity and range sought. Referring to FIG. 8, if sensor 10 is to be employed in an environment of high electro-magnetic fields, shielding can be provided to render sensor 10 substantially immune from externally generated fields. In such a case, a magnetic shield composed of a thin layer of phenolic insulating material 102 and layer of soft magnetic metal 104 is placed over the upper surface of upper pole portions 70 and 72 and wrapped downwardly along riser portions 86 and 88 to a point at least below the lowermost surface of shunt 80. The shield, consisting of insulating material 102 and soft magnetic metal 104 also overlies sensing region 84 and the components disposed therein.

Although gap dimensions can be adjusted for a given application the applicants have found that the spatial relationship of $G_s \leq G_c \leq G_r$ applies.

Referring to FIG. 7, applicants have found that in some applications a slight rotational repositioning of transducer 90 by an acute angle from the main magnetic field achieves better sensitivity at low sensed current levels providing higher output gain at low end. The offset also prevents overloads from affecting the transducer 90 because a fixed bias is impinging on the sensed field direction. This option is particularly advantageous when a given application requires resolution which is very tight, close to the zero point. Referring to FIG. 12, the shape of the biasing field within sensing region 84 in the area of transducer 90 is illustrated. When no current is flowing within conductor 52, the field within region 84 is established entirely by permanent magnets 94 and 96. As current flow 86 increases, a field component normal to offset axis 98 is established along principal axis 88 with a resultant field having lines of flux as illustrated in phantom. Sensor 90 is a bridge of resistors whose individual elements change resistance with increasing magnetic field intensity. Without the biasing effect of magnets 94 and 96, the bridge is normally balanced at zero magnetic field. In the presence of magnets 94 and 96 the field becomes unbalanced and produces a differential output voltage which is proportional to the amount of field transducer 90 senses along principal axis 88. As will be described hereinbelow, control circuit 16 will thus produce an output voltage which is proportional to the magnetic field and thus the current flow in conductor 52.

Figure 9:
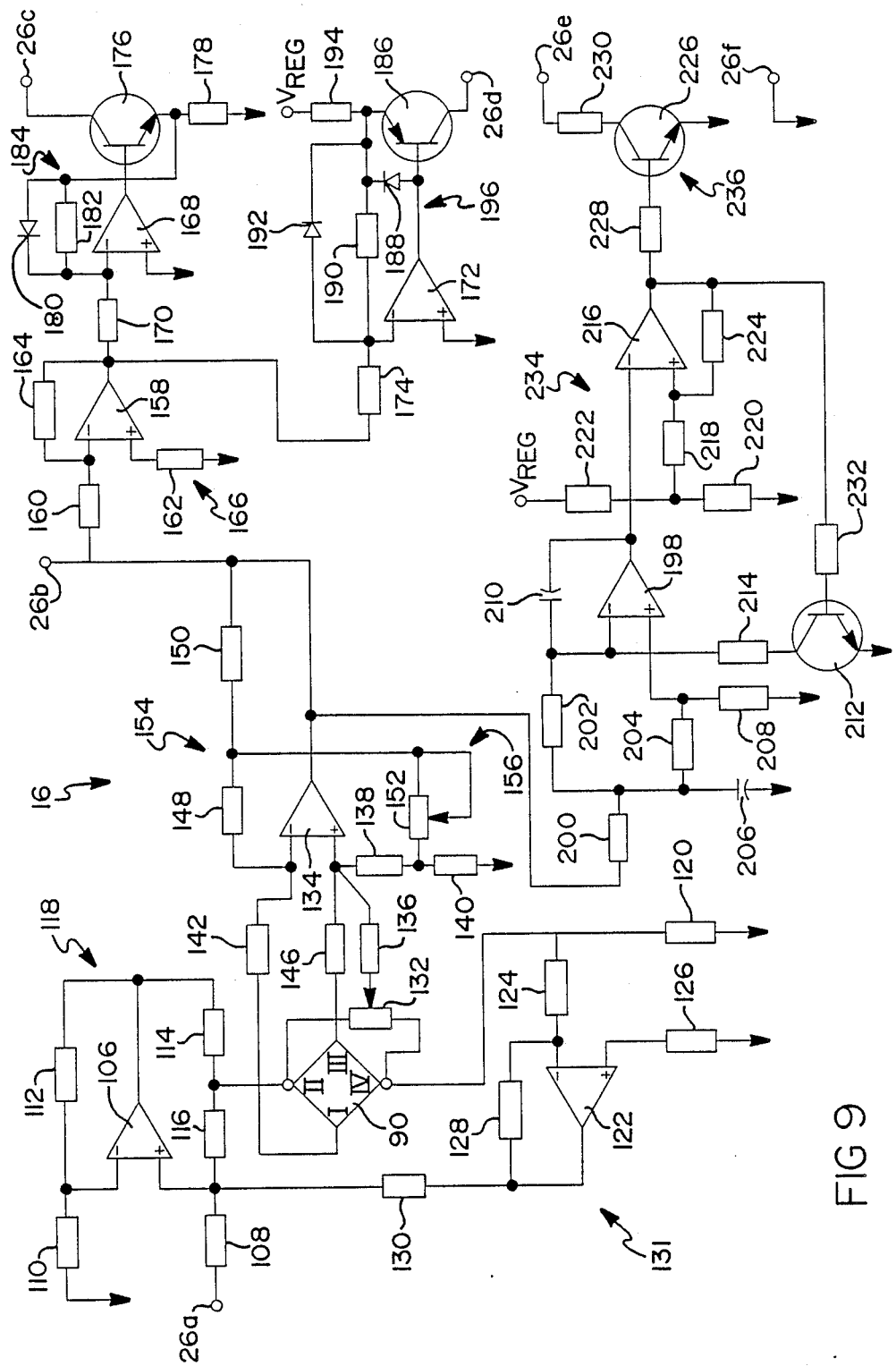
FIG. 9 is a schematic diagram of the control circuit employed in the preferred embodiment of the present invention.

Referring to FIG. 9, the elements of control circuit 16 are schematically illustrated which, in application, would be physically mounted on circuit board 18 within top 20 of housing assembly 12.

Control circuit 16 receives its power from a regulated voltage power supply at terminal 26a provided by the host system incorporating sensor 10. Terminal 26a is interconnected to the +terminal of an op amp 106 through a 100 K resistor 108. The −input of op amp 106 is connected to ground through a 100 K resistor 110 and to the output terminal of op amp 106 through a 10 K feedback resistor 112. The output of op amp 106 is interconnected with terminal II of transducer 90 through a 380 ohm resistor 114. The +input of op amp 106 is also interconnected to terminal II of transducer 90 through a 1 K resistor 116. Op amp 106 and resistors 108, 110, 112, 114 and 116 comprise a current source designated generally at 118 providing temperature compensation to the balance of circuit 16.

Terminal IV of transducer 90 is connected to ground through a 100 K resistor 120 and to the −input terminal of an op amp 122 through a 120 K resistor 124. The +terminal of op amp 122 is connected to ground through a 100 K resistor 126. The output terminal of op amp 122 is interconnected to its −input terminal through a 540 K feedback resistor 128 and to the +input terminal of op amp 106 through a 540 K resistor 130. Op amp 122 and resistors 120, 124, 126, 128, and 130 provide additional temperature compensation and represent an option in control circuit 16. If such compensation is not required, those elements can be deleted and terminal IV of transducer 90 can be tied directly to ground as an alternative.

Terminals II and IV of transducer 90 are interconnected by the fixed resistor portion of a 50 K potentiometer 132 acting as a voltage divider for providing zero field offset. The wiper of potentiometer 132 is interconnected to the +input terminal of an op amp 134 through a 247 K resistor 136. The +input terminal of op amp 134 is also interconnected to ground through a series combination of two 128 K resistors 138 and 140. Terminal I of transducer 90 is interconnected with the −input terminal of op amp 134 through a 10 K resistor 142 and terminal III of transducer 90 is interconnected with the +input terminal of op amp 134 through a 10 K resistor 146. The output terminal of op amp 134 is directly connected to a user accessible terminal 26b providing an analog voltage level proportional to sensed current.

The output of op amp 134 is also interconnected to the −input thereof through a series combination of two 128 K resistors 148 and 150. The point of common connection between resistors 148 and 150 is interconnected to the point of common connection between resistors 138 and 140 by the fixed resistance portion of a potentiometer 152. The point of common connection between resistors 148 and 150 is also directly connected to the wiper of potentiometer 152. Op amp 134 and resistors 142, 146, 148 and 150 comprise a T-type amplifier designated by arrow 154 and resistors 138 and 140 with potentiometer 152 comprise a temperature compensation circuit designated generally 156.

The output of op amp 134 is interconnected to the −input of an op amp 158 through a 10 K resistor 160. The +input of op amp 158 is connected to ground through a 11 K resistor 162. The output of op amp 158 is interconnected ( with the −input thereof through a 22 K feedback resistor 164. Op amp 158 and resistors 160, 162 and 164 comprise an inverting amplifier designated generally at 166. The output of amplifier 166 is interconnected to the −input of an op amp 168 through a 10 K resistor 170 and to the −input of another op amp 172 through a second 10 K resistor 174. The +input terminals of both op amps 168 and 172 are connected to ground. The output of op amp 168 is connected to the base of a type 2N2222 transistor 176. The collector of transistor 176 is connected to a user accessible terminal 26c providing a current sink signal proportional to sensed current for EMI and RFI rejection purposes. The emitter of transistor 176 is interconnected to ground through a 10 ohm current limiting resistor 178. The emitter of transistor 176 is also interconnected to the −input of op amp 168 through the parallel combination of a 1N4148 diode 180 and a 10 K resistor 182. Op amp 168 and its associated componentry constitutes a voltage controlled current sink circuit 184.

The output of op amp 172 is interconnected to the base of a type 2W2907 transistor 186 and interconnected with a −input thereof through a series combination of a type 1N4148 diode 188 and a parallel combination of a 10 K resistor 190 and a type 1W4148 diode 192. A point of common connection between diode 188 and resistor 190 is connected to the emitter of transistor 186. The emitter of transistor 186 is also interconnected with the source of regulated voltage at terminal 26a through a 10 ohm current limiting resistor 194. Op amp 172 and its associated componentry function as a voltage controlled current source circuit designated generally 196 providing an output at the collector of transistor 186 to a user accessible terminal 26d a current source signal proportional to sensed current.

The output terminal of op amp 134 is interconnected to the −input of an op amp 198 through a series combination of a 5K resistor 200 and a 100 K resistor 202. The point of common connection between resistors 200 and 202 is interconnected to the +input terminal of op amp 198 through a 51 K resistor 204 and to ground through a 100 pico farad capacitor 206. The +input terminal of op amp 198 is connected to ground through a 51 K resistor 208. The output of op amp 198 is interconnected to the −input thereof through a 0.1 micro farad capacitor 210. The −input terminal of op amp 198 is interconnected to the collector of a type 2N2222 transistor 212 through a 51 K resistor 214. The emitter of transistor 212 is connected to ground. The output of op amp 198 is connected to the −input of another op amp 216. The +input terminal of op amp 216 is connected to ground through a series combination of a 50 K resistor 218 and a 10 K resistor 220. The point of common connection between resistors 218 and 220 is interconnected to the regulated voltage supply at terminal 26a through a 10 K resistor 222. The output terminal of op amp 216 is interconnected to the +input terminal thereof through a 2.2 M resistor 224 and is interconnected to the base of a type 2N2222 transistor 226 through a 3.3 K resistor 228. The collector of transistor 226 is connected to a user accessible terminal 26e through a 220 ohm current limiting resistor 230. The emitter of transistor 226 is connected to ground. Finally, a user accessible, or ground terminal 26f is provided on top 20 of housing assembly 12. The output terminal of op amp 216 is innerconnected to the base of transistor 212 through a 5 K resistor 232. Op amps 198 and 216 as well as their associated componentry comprise a voltage control oscillator designated generally at 234. VCO 234 provides a modulated square wave output to transistor 226 which, with its associated components comprise an output circuit 236 providing isolation to control circuit 16. The output that terminal 26e provides a frequency modulated signal proportional to sensed current.

Control circuit 18 thereby provides a plurality of user accessible outputs for extreme flexibility and application. For the specific circuit components cited hereinabove, a regulated voltage level in the range of 5 to 30 volts is contemplated.

Referring to FIG. 14, a typical output signal versus load current characteristic is provided.

Referring to FIGS. 10, 11, and 13, an alternative embodiment of the present invention is illustrated. An alternative current sensor 240 includes a housing assembly 242 composed of a top portion 244 and a body portion 246. A flux concentrator 248 and circuit board (not shown) are contained within housing 242 in the manner described with reference to current sensor 10 hereinabove. The principal difference between the two embodiments is in the method of generating a biasing field.

Flux concentrator 248 is formed of two generally C-shaped pole pieces 250 and 252 which coact to form a magnetic pole structure which substantially encircles a cross-sectional shape of an electrical conductor 254. Pole pieces 250 and 252 comprise complimentarily shaped vertically disposed riser portions 256 and 258, respectively, and an upper pair of horizontally oriented inwardly directed pole portions or pieces 260 and 262 integrally depending from riser portions 256 and 258, respectively. Concentrator 248 further includes a lower pair of horizontally disposed inwardly directed pole portions or pieces 264 and 266 integrally depending from riser portions 256 and 258, respectively.

Pole portions 260 and 262 are spaced by a horizontal gap designated $G_r$ and lower pole portions 264 and 266 are separated by a horizontal calibration gap designated $G_c$, which function as described hereinabove with reference to the preferred embodiment of the invention with the exception that upper pole pieces 260 and 262 define localized inwardly directed extension portions 26 and 270, formed of the same material from which pole pieces 250 and 252 are constructed. Extension portions 268 and 270 act to dimensionally reduce gap $G_r$ within the magnetic sensing region 272 in the area adjacent MR transducer 274. Two electrical coils, 276 and 278, respectively, are wound on the free end portions of a generally C-shaped soft magnetic metal flux return path. MR transducer 274 is disposed between coils 276 and 278 and in alignment with extension portions 268 and 270. Extension portions 268 and 270 are included to prevent magnetic fringing in the area of MR transducer 274. Coils 276 and 278 are electrically connected in additive circuit as will be described in detail hereinbelow to generate a biasing or offset component designated by axis arrow 282 disposed normally to principal axis arrow 284. Return path 280 is mounted on a thin layer of insulative phenolic material 286 carried on the upper surface of a magnetic shunt 288 which operates in the same manner as return path 100, insulating material 182 and shunt 80 described with reference to the preferred embodiment of the present invention.

Referring to FIG. 10, a second current source 290 is in circuit with coils 278 and 276. Current source 290 includes an op amp 292 having a +input terminal thereof connected with the source of regulated voltage through a 100 K resistor 294 and interconnected to the output thereof through a series combination of a 1 M resistor 296 and a 380 ohm resistor 298. The point of common connection between resistors 296 and 298 is electrically interconnected to ground through the series combination of coils 276 and 278. The −input of op amp 292 is electrically interconnected to ground through a 100 K ohm resistor 300 and to the output of op amp 292 through a 10 K feedback resistor 302. For the alternative embodiment of the invention illustrated in FIG. 11, the circuit of FIG. 10 would be additive to that of FIG. 9 to provide electrical excitation of coils 276 and 278.

Current source 290 provides constant NI (amp-turns) to constantly bias transducer 274. This allows adjustment of the bias field for scaling or temperature compensation. Injection of a reference voltage at a terminal 304 will cause this adjustment to bias NI and thereby to bias the magnetic field within region 272.

It is to be understood that the invention has been described with reference to specific embodiments to provide the features and advantages previously described, and that such specific embodiments are susceptible of modification, as will be apparent to those skilled in the art. Accordingly, the foregoing is not to be construed in a limiting sense.

We claim:

1. A current sensor for measuring current flow in an electrical conductor, said sensor comprising:
   a magnetic flux concentrator comprising a magnetic pole structure substantially encircling the cross-sectional shape of said conductor and including two magnetic pole portions spaced to provide a magnetic sensing region therebetween whereby electrical current flowing in said conductor will induce a magnetic field within said region;
   means disposed to measure a component of magnetic field intensity along a principal axis within said sensing region and operative to generate an output signal as a function thereof; and
   means operative to generate a component of magnetic field intensity within said region along an axis offset from said principal axis, said offset component having a characteristic magnitude substantially unaffected by flow of current in said conductor.

2. A current sensor for measuring current flow in an electrical conductor, said sensor comprising:
   an insulated housing;
   a magnetic flux concentrator in said housing comprising a magnetic pole structure substantially encircling the cross-sectional shape of said conductor in spaced relation thereto and including two magnetic pole portions spaced to provide a magnetic sensing region therebetween whereby electrical current flowing in said conductor will induce a magnetic field within said region;
   magnetoresistive means disposed to measure a component of magnetic field intensity along a principal axis within said sensing region and operative to generate an electrical signal as a function thereof;
   means in-circuit with said magnetoresistive means operative to generate an output signal as a function of said electrical signal; and
   means operative to generate a component of magnetic field intensity within said region along an axis offset from said principal axis, said offset component having a characteristic magnitude substantially unaffected by flow of current in said conductor.

3. The current sensor of claim 2, wherein said offset axis is substantially normal to said principal axis.

4. The current sensor of claim 2, wherein said offset component of magnetic field intensity has a substantially constant magnitude.

5. The current sensor of claim 2, wherein said flux concentrator further comprises a magnetic shunt traversing said magnetic sensing region to divert a substantial portion of flux within said concentrator from said sensing region.

6. The current sensor of claim 5, wherein said shunt is formed of material having a characteristic permeability equal or exceeding the characteristic permeability of material forming said pole structure.

7. The current sensor of claim 5, wherein said shunt bridges said magnetic pole portions and is electrically insulated therefrom.

8. The current sensor of claim 2, wherein said flux concentrator further comprises a calibration gap formed in said magnetic pole structure in series with said sensing region.

9. The current sensor of claim 2, wherein said means operative to generate a component of magnetic field intensity along an offset axis comprises at least one permanent magnet disposed effectively adjacent said magnetoresistive means.

10. The current sensor of claim 9, wherein said permanent magnet is disposed with its poles in substantial axial alignment with said electrical conductor.

11. The current sensor of claim 9, wherein said means operative to generate a component of magnetic field intensity along an offset axis further comprises a magnetically conductive flux return path extending adjacent said permanent magnet and said magnetoresistive means.

12. The current sensor of claim 2, wherein said means operative to generate a component of magnetic field intensity along an offset axis comprises at least one coil disposed effectively adjacent said magnetoresistive means.

13. The current sensor of claim 12, wherein said coil is formed about an axis substantially parallel with said electrical conductor.

14. The current sensor of claim 12, wherein said means operative to generate a component of magnetic field intensity along an offset axis further comprises a magnetically conductive flux return path extending axially through said coil and adjacent said magnetoresistive means.

15. The current sensor of claim 2, wherein said in-circuit means is further operative to simultaneously generate reformatted multiple output signals as a function of said electrical signal.

16. The current sensor of claim 2, wherein said sensor further comprises shield means disposed to isolate said magnetic flux concentrator and magnetoresistive means from externally generated electro-magnetic fields.

17. The current sensor of claim 2, wherein said principal axis is substantially parallel with said electrical conductor.

18. The current sensor of claim 2, wherein said principal axis is angularly offset from said electrical conductor by an acute angle.

19. The current sensor of claim 2, wherein said housing comprises a body portion for receiving said magnetic flux concentrator therein and a top portion cooperating in-assembly with said body portion to insulatively retain said flux concentrator therein, said housing defining a through passageway for receiving said electrical conductor and comprising fastening means for temporarily retaining said body and top portions in-assembly prior to installation and registering bores for receiving mounting means in end-use installation.

20. The current sensor of claim 19, wherein said top portion has a cavity formed therein for receiving said means in-current with said magnetoresistive means.

21. The current sensor of claim 19, wherein said top portion carries at least one terminal means for electrically interconnecting said means in-circuit with said magnetoresistive means with end-user application circuitry.

22. The current sensor of claim 2, wherein at least one of said magnetic pole portions defines an area adjacent said magnetoresistive means extending into said magnetic sensing region to effect a localized dimensional reduction of said region.

23. A current sensor for measuring current flow at a predetermined location within an elongated electrical conductor, said sensor comprising:
an insulated housing defining a passageway therethrough for receiving said conductor;
magnetic flux concentrator in said housing comprising two generally C-shaped magnetic pole pieces facing each other to define a conductor receiving cavity therebetween and including a first complementary opposed pair of pole portions spaced by a gap dimension $G_r$ and a second complementary opposed pair of pole portions spaced by a gap dimension $G_c$, said first pair of pole portions providing a magnetic sensing region therebetween whereby electrical current flowing to said predetermined location within said conductor will induce a magnetic field within said region, said flux concentrator further comprising a magnetic shunt formed of material having a characteristic permeability equal to or exceeding the characteristic permeability of material forming said pole pieces, said shunt substantially bridging said first pair of pole portions and defining an effective gap dimension $G_s$ therewith, wherein $G_s \leq G_c \leq G_r$, whereby said shunt is operative to divert a substantial portion of the flux within said concentrator from said sensing region;
magnetoresistive means disposed within said magnetic sensing region to measure a component of magnetic field intensity along a principal axis within said sensing region and operative to generate an electrical signal as a function thereof;
circuit means operative to generate at least one output signal representative of sensed current in said conductor in response to said electrical signal; and
means operative to generate a component of magnetic field intensity within said region along an axis substantially normal to said principal axis, said offset component having a substantially constant magnitude unaffected by flow of current in said conductor.

24. The current sensor of claim 1, wherein said means disposed to measure a component of magnetic field intensity comprises a magnetoresistive device.

25. The current sensor of claim 24, wherein said magnetoresistive device comprises a plurality of geometrically offset magnetoresistive elements electrically interconnected in a bridge configuration.

26. The current sensor of claim 2, wherein said magnetoresistive means comprises a plurality of geometrically offset magnetoresisitive elements electrically interconnected in a bridge configuration.

27. The current sensor of claim 23, wherein said magnetoresistive means comprises a plurality of geometrically offset magnetoresistive elements electrically interconnected in a bridge configuration.

28. The current sensor for measuring current flow in a electrical conductor, said sensor comprising:
means operative to define a magnetic sensing region proximate said conductor whereby electrical current flowing in said conductor will induce a magnetic field within said region;
means disposed to measure a component of magnetic field intensity along a principal axis within said sensing region and operative to generate an output signal as a function thereof, said component measurement means comprising a plurality of geometrically offset magnetoresistive elements electrically interconnected in a bridge configuration; and
means operative to generate a component of magnetic field intensity within said region along an axis offset from said principal axis, said offset component having a characteristic magnitude substantially unaffected by flow of current in said conductor.

* * * * *